(12) United States Patent
Roh et al.

(10) Patent No.: US 7,601,273 B2
(45) Date of Patent: Oct. 13, 2009

(54) POLISHING SLURRY COMPOSITION AND METHOD OF USING THE SAME

(75) Inventors: Hyun Soo Roh, Gunpo-si (KR); Tae Won Park, Suwon-si (KR); Tae Young Lee, Gunpo-si (KR); In Kyung Lee, Euiwang-si (KR); Chin Ho Lee, Chunan-si (KR); Young Woo Kim, Chunan-si (KR); Moon Ro Choi, Chunan-si (KR); Jong Seop Kim, Chunan-si (KR)

(73) Assignees: Cheil Industries, Inc., Gumi-si, Gyeongsangbuk-do (KR); MEMC Korea Co., Ltd., Chunan-si, Choongcheongnam-do (KR)

(*) Notice: Subject to any disclaimer, the term of this patent is extended or adjusted under 35 U.S.C. 154(b) by 0 days.

(21) Appl. No.: 11/367,406

(22) Filed: Mar. 6, 2006

(65) Prior Publication Data
US 2006/0196850 A1 Sep. 7, 2006

(30) Foreign Application Priority Data
Mar. 7, 2005 (KR) .................. 10-2005-0018492

(51) Int. Cl.
*C09K 13/00* (2006.01)

(52) U.S. Cl. .............. 252/79.1; 252/79.2; 252/79.3; 252/79.4; 438/692; 438/693; 216/88; 216/89

(58) Field of Classification Search ............. 252/79.1; 438/692; 216/88
See application file for complete search history.

(56) References Cited

U.S. PATENT DOCUMENTS

| | | | |
|---|---|---|---|
| 3,715,842 A | 2/1973 | Tredinnick et al. | |
| 4,137,303 A * | 1/1979 | Gaffar et al. | 424/52 |
| 4,169,337 A | 10/1979 | Payne | |
| 5,352,277 A | 10/1994 | Sasaki | |
| 6,189,546 B1 | 2/2001 | Zhang et al. | |
| 6,855,266 B1 * | 2/2005 | Wang et al. | 252/79.1 |
| 7,086,935 B2 * | 8/2006 | Wang | 451/41 |
| 2003/0136055 A1 * | 7/2003 | Li et al. | 51/298 |
| 2005/0090104 A1 * | 4/2005 | Yang et al. | 438/689 |
| 2005/0194358 A1 * | 9/2005 | Chelle | 216/88 |
| 2006/0175295 A1 * | 8/2006 | Chu et al. | 216/88 |

* cited by examiner

*Primary Examiner*—Nadine Norton
*Assistant Examiner*—Maki Angadi
(74) *Attorney, Agent, or Firm*—Lee & Morse, P.C.

(57) ABSTRACT

A polishing slurry composition including an abrasive, a pH-adjusting agent, a water-soluble thickening agent, and a chelating agent, wherein the chelating agent includes at least one of an acetate chelating agent and a phosphate chelating agent, and a method of using the same.

13 Claims, 1 Drawing Sheet

Initial Polishing Process, using an Initial Polish Slurry — 100

Final Polishing Process, using a Final Polish Slurry — 200

POLISHING SLURRY COMPOSITION AND METHOD OF USING THE SAME

BACKGROUND OF THE INVENTION

1. Technical Field

The present invention relates to a slurry composition for chemical mechanical polishing, and a method of using the same. More particularly, the present invention relates to a slurry composition that may be employed to reduce a number of surface defects formed on a wafer, thereby reducing the surface microroughness and haze of the wafer.

2. Background Art

Wafers, e.g., silicon wafers, are commonly used as substrates for manufacturing semiconductor devices. Silicon wafers are produced through a series of processes, including single crystal growth, slicing, lapping, etching, polishing and cleaning. In particular, polishing processes may be employed to remove surface and subsurface defects formed in the previous processes, including, e.g., scratches, splits, grain distortion, surface microroughness, surface topographical defects, etc., to produce defect-free wafers with a specular surface. Subsurface defects have been recently recognized to be industrially important for their deleterious effects on the electrical properties of semiconductor circuits formed on the wafers.

Chemical mechanical polishing (CMP), which is typically a final process in the production of silicon wafers, may be performed to remove physical surface defects, e.g., microscratches, and to lower the surface microroughness, thus making the surface of the wafers smooth. Accordingly, wafers that have been subjected to the CMP process may have specular surfaces with few defects.

The CMP process may consist of multiple steps. One polishing step may be an initial polishing step for removing deep surface scratches. This typically requires a high polishing rate. A subsequent polishing step may be used to remove microscratches remaining after the initial polishing step. The subsequent polishing step may serve to lower the surface microroughness of the wafer to the order of a few angstroms (Å), resulting in the desired specular surface. These polishing steps may involve the use of hard or soft urethane polishing pads, together with a slurry, e.g., a silica-containing slurry, as a polishing solution.

The polishing of the wafer surface involves both mechanical action and the reaction of one or more chemical agents. The polishing pad provides mechanical polishing, often in combination with an abrasive agent in the polishing solution (slurry). The slurry may assist in the mechanical polishing by the polishing pad, as well as providing chemical polishing.

In detail, in CMP processes, slurries are used to promote chemical and physical polishing. Slurries may contain, e.g., an abrasive, a base as a pH-adjusting agent, and deionized water. Silica is frequently used as the abrasive. Potassium hydroxide, sodium hydroxide and ammonium hydroxide are bases that are frequently used to adjust the pH.

To enhance polishing, organic or inorganic additives may also be added. For example, nonionic surfactants, amine polishing accelerants, and the like may be used to increase the polishing rate, to improve the degree of cleaning of the polished surface, and to enhance the dispersibility of abrasives. It is common to select slurries based on the particular processing requirements of the CMP process.

Despite the sophistication of currently available CMP processes, further improvements in the performance of polishing pads and slurries is desirable for the production of high-quality, large-diameter wafers. In particular, in processing large-diameter, e.g., 300 mm, wafers, there is a need for slurries capable of achieving substantially defect-free surfaces.

SUMMARY OF THE INVENTION

The present invention is therefore directed to a polishing slurry composition, and a method of using the same, which substantially overcomes one or more of the problems due to the limitations and disadvantages of the related art.

It is therefore a feature of an embodiment of the present invention to provide a polishing slurry composition suitable for the manufacture of high-performance semiconductor devices.

It is therefore another feature of an embodiment of the present invention to provide a polishing slurry composition suitable for the final polishing of a wafer.

At least one of the above and other features and advantages of the present invention may be realized by providing a polishing slurry composition including an abrasive, a pH-adjusting agent, a water-soluble thickening agent, and a chelating agent, wherein the chelating agent includes at least one of an acetate chelating agent and a phosphate chelating agent.

The chelating agent may include at least one acetate chelating agent, and the acetate chelating agent may be selected from the group consisting of ethylenediaminetetraacetic acid, diethylenetriaminepentaacetic acid, N-(hydroxyethyl)ethylenediaminetriacetic acid, nitrilotriacetic acid, and salts thereof. The chelating agent may include two different acetate chelating agents, each of which may be selected from the group consisting of ethylenediaminetetraacetic acid, diethylenetriaminepentaacetic acid, N-(hydroxyethyl)ethylenediaminetriacetic acid, nitrilotriacetic acid, and salts thereof.

The chelating agent may include at least one acetate chelating agent, and the acetate chelating agent may be present at a concentration of between about 0.001 and 0.5 percent by weight, based on the total weight of the slurry composition.

The chelating agent may include at least one phosphate chelating agent, and the phosphate chelating agent may be selected from the group consisting of sodium salts of ethylenediaminetetra(methylene phosphonic acid), ammonium salts of ethylenediaminetetra(methylene phosphonic acid), amino tri(methylene phosphonic acid), and diethylenetriaminepenta(methylene phosphonic acid).

The chelating agent may include at least one phosphate chelating agent, and the phosphate chelating agent may be present at a concentration of between about 0.0002 and 5 percent by weight, based on the total weight of the slurry composition.

The chelating agent may include at least one acetate chelating agent and at least one phosphate chelating agent. The acetate chelating agent may be present at a concentration of between about 0.001 and 0.5 percent by weight, based on the total weight of the slurry composition, and the phosphate chelating agent may be present at a concentration of between about 0.0002 and 5 percent by weight, based on the total weight of the slurry composition. The ratio of the phosphate chelating agent to the acetate chelating agent may be in the range of between about 0.2:1 and 10:1. The acetate chelating agent may be selected from the group consisting of EDTA, $Na_4$EDTA, $Na_2$EDTA, $(NH_4)_4$EDTA, and $(NH_4)_2$EDTA, and the phosphate chelating agent may be selected from the group consisting of sodium salts of ethylenediamine tetra(methylene phosphonic acid), and ammonium salts of ethylenediaminetetra(methylene phosphonic acid).

The abrasive may be colloidal silica.

The water-soluble thickening agent may be water-soluble cellulose having a weight average molecular weight of between about 1,000,000 and 4,000,000.

At least one of the above and other features and advantages of the present invention may also be realized by providing a method of polishing a wafer, including subjecting the wafer to a final polishing process using a final slurry, wherein the final slurry includes an abrasive, a pH-adjusting agent, a water-soluble thickening agent, and a chelating agent, wherein the chelating agent includes at least one of an acetate chelating agent and a phosphate chelating agent.

The chelating agent may include at least one acetate chelating agent, and the acetate chelating agent may be selected from the group consisting of ethylenediaminetetraacetic acid, diethylenetriaminepentaacetic acid, N-(hydroxyethyl)ethylenediaminetriacetic acid, nitrilotriacetic acid, and salts thereof. The chelating agent may include at least one acetate chelating agent, and the acetate chelating agent may be present at a concentration of between about 0.001 and 0.5 percent by weight, based on the total weight of the final slurry.

The chelating agent may include at least one phosphate chelating agent, and the phosphate chelating agent may be selected from the group consisting of sodium salts of ethylenediaminetetra(methylene phosphonic acid), ammonium salts of ethylenediaminetetra(methylene phosphonic acid), amino tri(methylene phosphonic acid), and diethylenetriaminepenta(methylene phosphonic acid).

The chelating agent may include at least one phosphate chelating agent, and the phosphate chelating agent may be present at a concentration of between about 0.0002 and 5 percent by weight, based on the total weight of the final slurry.

The chelating agent may include at least one acetate chelating agent and at least one phosphate chelating agent. The acetate chelating agent may be present at a concentration of between about 0.001 and 0.5 percent by weight, based on the total weight of the final slurry, and the phosphate chelating agent may be present at a concentration of between about 0.0002 and 5 percent by weight, based on the total weight of the final slurry.

The ratio of the phosphate chelating agent to the acetate chelating agent may be in the range of between about 0.2:1 and 10:1.

BRIEF DESCRIPTION OF THE DRAWINGS

The above and other features and advantages of the present invention will become more apparent to those of ordinary skill in the art by describing in detail exemplary embodiments thereof with reference to the attached drawing in which.

DETAILED DESCRIPTION OF THE INVENTION

Figure 1:
FIG. 1 illustrates a flow chart of a method of polishing a wafer according to the present invention.

Korean Patent Application No. 10-2005-0018492, filed on Mar. 7, 2005, in the Korean Intellectual Property Office, and entitled: "Polishing Slurry Composition for Improving Surface Quality of Silicon Wafer and Method for Polishing Silicon Wafer Using the Same," is incorporated by reference herein in its entirety.

The present invention will now be described more fully hereinafter with reference to the accompanying drawing, in which an exemplary embodiment of the invention is shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

The slurry composition according to the present invention may be used for final polishing of a wafer, e.g., to remove surface defects, and may include an abrasive, a water-soluble thickening agent, a pH-adjusting agent, an acetate and/or a phosphate chelating agent, and deionized water. The slurry composition may exhibit enhanced storage stability, and may reduce haze, light point defects (LPDs) and surface microroughness on the surface of a wafer, e.g., one used for manufacturing high-performance semiconductor devices at 65 nm or below. The slurry composition may enhance the uniformity of the size distribution of the abrasive contained therein.

The slurry composition may include the abrasive, e.g., a high-purity colloidal silica abrasive, to enhance the mechanical polishing power of the slurry. The colloidal silica may have an average diameter of about 20-100 nm. In an implementation, the colloidal silica may have an average diameter of about 30-80 nm, in order to reduce the relative contribution of mechanical polishing in relation to the balance of chemical and mechanical polishing.

The use of the colloidal silica having a particle diameter of less than about 20 nm may result in the mechanical polishing effects of the slurry being unsatisfactorily low. Moreover, the silica particles may be unstable in the presence of substances removed from the wafer during polishing, which may be undesirable. The unstable particles may leave LPDs on the surface of a wafer, which may deteriorate the quality of the wafer. The use of colloidal silica having a particle diameter exceeding about 100 nm may provide a high polishing rate, but undesirable surface or subsurface defects may be formed.

The slurry composition may include the silica at a concentration of between about 0.075 and 15 percent by weight, based on the total weight of the slurry composition. In an implementation, the concentration may be between about 0.1 and 8 percent by weight, in order to make the silica more dispersible. This may reduce or prevent the formation of aggregates having a size of 0.5 microns or above.

The use of silica at a concentration of less than about 0.075 percent by weight may result in the polishing rate being unsatisfactorily low. The use of silica at a concentration of more than about 15 percent by weight may reduce the dispersion stability, and may result in the undesirable generation of large amounts of aggregates having a size of 0.5 µm or above.

The slurry composition may include the water-soluble thickening agent, e.g., a water-soluble polymer, to enhance the mechanical polishing effects. The water-soluble thickening agent may include, e.g., a water-soluble cellulose such as hydroxyethylcellulose, hydroxypropylcellulose, etc. The water-soluble celluloses may be used to stabilize the dispersion of silica. Where the water-soluble thickening agent is a water-soluble cellulose, it may have a weight average molecular weight of between about 1,000,000 and 4,000,000, and may be included in the slurry at a concentration of between about 0.01 and 2 percent by weight, based on the total weight of the slurry composition, in order to reduce the formation of LPDs on the surface of the wafer being polished.

Without being bound by any particular theory, the effectiveness of water-soluble cellulose of the stated weights and concentrations may be the result of three-dimensional crosslinking by the cellulose under the conditions of use of the slurry. The three-dimensional crosslinking effects of the cellulose may reduce collision and aggregation of the silica particles that result from motion thereof, e.g., Brownian motion, thereby reducing or preventing the conversion of silica aggregates into fine silica crystals.

The slurry composition may include the pH-adjusting agent to enhance the chemical polishing power of the slurry. The pH-adjusting agent may be added in sufficient quantities to adjust the pH of the slurry to between about 9 and 11.5. The pH-adjusting agent may include, e.g., nitrogen bases such as ammonia and amines, metal hydroxides such as NaOH and KOH, and the like, which may be used alone or in combination.

The slurry composition may include the acetate and/or phosphate chelating agents in order to reduce or prevent metal ion impurities from remaining on the surface of a wafer or diffusing into the subsurface of a wafer, and in order to further improve the dispersion stability of the silica.

The acetate chelating agents may include, e.g., ethylenediaminetetraacetic acid, diethylenetriaminepentaacetic acid, N-(hydroxyethyl)ethylenediaminetriacetic acid, nitrilotriacetic acid, salts thereof, and mixtures thereof. The slurry may include one or more acetate chelating agents, which may be included in the slurry in amounts where the zeta potential of the slurry is unchanged. The acetate chelating agents may be included in the slurry at a concentration of between about 0.001 and 0.5 percent by weight, based on the total weight of the slurry composition.

The use of acetate chelating agents in concentrations less than stated above may result in the acetate chelating agent having no appreciable effect on the surface microroughness of the wafer. The use of acetate chelating agents in concentrations greater than stated above may detrimentally affect the performance of the slurry by changing the zeta potential thereof from a negative value to a positive value, which is undesirable in terms of dispersion stability.

The phosphate chelating agents may include, e.g., sodium salts of ethylenediaminetetra(methylene phosphonic acid), ammonium salts of ethylenediaminetetra(methylene-phosphonic acid), amino tri(methylene phosphonic acid), diethylenetriaminepenta(methylene phosphonic acid), and mixtures thereof. The slurry may include one or more phosphate chelating agents, which may exhibit dispersion stability enhancing characteristics similar to those of the acetate chelating agents, due to their similar structures.

The inclusion of the phosphate chelating agents in the slurry may result in a somewhat different polishing quality as compared to the acetate chelating agents, due to the high etching power that may be exhibited by the phosphate chelating agents. The phosphate chelating agents may be included in the slurry at a concentration of between about 0.0002 and 5 percent by weight, based on the total weight of the slurry composition.

The use of phosphate chelating agents in concentrations less than stated above may result in the phosphate chelating agents having no appreciable effect on improvement in the polishing quality. The use of phosphate chelating agents in concentrations greater than stated above may result in an undesirable increase in the surface microroughness of the target wafer.

The acetate and phosphate chelating agents may be simultaneously used in the slurry according to the present invention. In an embodiment, EDTA salts such as $Na_4EDTA$, $Na_2EDTA$, $(NH_4)_4EDTA$, $(NH_4)_2EDTA$ and $CaNa_2EDTA$ may be used as the acetate chelating agents. Including these acetate chelating agents in the slurry may provide significant reductions in the surface microroughness of the target wafer.

Without being bound by any particular theory, the effectiveness of these acetate chelating agents in reducing surface microroughness may be due to ionic reactions between polar groups of the water-soluble thickening agent and salts of the chelating agents, thereby promoting the hydration of the water-soluble thickening agent. As a result, the solubility may be increased and the crosslinking of the water-soluble thickening agent may be improved, which may lead to an enhanced dispersion stability of the water-soluble thickening agent or the abrasive. Further, the simultaneous use of acetate chelating agents, e.g., EDTA, and phosphate chelating agents may further improve the dispersion stability of the abrasive, thereby preventing an increase in the amount of large particles during long-term storage.

In an implementation, the phosphate chelating agent may be used in an amount of between about 0.2 and 10 times the amount of EDTA, in which case the slurry composition may exhibit significantly enhanced dispersion stability and storage stability. At the same time, this slurry composition may provide desirable reductions in surface microroughness and haze on the target wafer.

The present invention also provides a method for polishing a wafer using the polishing slurry compositions described above. FIG. 1 illustrates a flow chart of a method of polishing a wafer according to the present invention. The method may be employed to polish a silicon wafer using a single-wafer or multi-wafer polisher, and may provide for reductions in LPDs, haze and surface microroughness on the target wafer. Referring to FIG. 1, the method may be employed as a final polishing process 200, which may be preceded by an initial polishing process 100.

In an implementation, the method may employ a slurry according to the present invention in a single-wafer polisher. The slurry may contain an amine-containing alkali base to promote chemical etching. The method may employ one or more polishing pads for polishing the wafer, including, e.g., a hard polyurethane non-woven fabric for primary polishing, and a soft polyurethane foam polishing cloth for final polishing.

Exemplary slurry compositions and methods according to the present invention will be explained in the following examples. However, these examples are not to be construed as limiting the scope of the invention.

EXAMPLES 1 to 5

Exemplary slurry compositions were prepared in accordance with the following procedure. First, based on the total weight of each of the slurry compositions, 5% by weight of colloidal silica having a silica particle size of 35-50 nm, 3% by weight of ammonia, 0.8% by weight of tetramethylammonium hydroxide (TMAH) as a pH-adjusting agent, and 0.2% by weight of a hydroxypropylcellulose as a thickening agent were mixed together. Then, at least one additive, in the amount indicated in Table 1, below, was added to the mixture to prepare the exemplary slurry compositions.

Each of the slurries was used to finally polish 8 inch (100) p-type wafers, which were initially polished using a Strasbaugh polisher (Strasbaugh, San Luis Obispo, Calif., USA) and Syton HT-50 (DA NanoMaterials L.L.C., Tempe, Ariz., USA). After completion of the final polishing, wafer surface characteristics, such as LPDs, haze and microroughness, were evaluated.

The surface quality, such as LPDs and haze, was evaluated using a Surfscan SP-1 DLS (KLA-Tencor, San Jose, Calif., USA), and the surface microroughness was evaluated using an interferometer (Chapman Instruments, Rochester, N.Y., USA). An accusizer, which is an apparatus for measuring the presence of large particles having a size of 0.5 microns or above, was used to evaluate the dispersion stability of the slurries. The results are shown in Table 1.

Comparative Example 1

A comparative polishing slurry composition was prepared by mixing 5% by weight of colloidal silica having a silica particle size of 35-50 nm, 3% by weight of ammonia, 0.8% by weight of TMAH as a pH-adjusting agent, and 0.2% by weight of hydroxypropylcellulose as a thickening agent, based on the total weight of the slurry composition.

The comparative slurry composition was used for final polishing in the same manner as in Examples 1 to 5. After completion of the polishing, the wafer surface characteristics, such as LPDs, haze and microroughness, were evaluated. The results are shown in Table 1.

TABLE 1

| Example No. | Additional additive | | | | Change in amount of large particles[2] | Haze (ppm) | LPD ($\geqq 0.08$ μm) | $Rq^3$ (Å) |
|---|---|---|---|---|---|---|---|---|
| | Acetate chelating agent | | Phosphate chelating agent | | | | | |
| | Kind | Content (%) | Kind | Content (%) | | | | |
| Ex. 1 | EDTA | 0.1 | X | — | 1320 | 0.060 | 54 | 1.5 |
| Ex. 2 | Na$_4$EDTA | 0.1 | X | — | 150 | 0.045 | 34 | 1.2 |
| Ex. 3 | (NH$_4$)$_4$EDTA | 0.1 | X | — | 320 | 0.051 | 30 | 1.1 |
| Ex. 4 | (NH$_4$)$_4$EDTA | 0.1 | Na$_2$EDTMPA[1] | 0.16 | 30 | 0.038 | 14 | 1.0 |
| Ex. 5 | X | — | Na$_2$EDTMPA | 0.16 | 420 | 0.043 | 29 | 1.2 |
| Comp. Ex. 1 | X | — | X | — | 1720 | 0.050 | 56 | 1.8 |

Notes:
[1] Sodium salt of ethylenediaminetetra(methylene phosphonic acid);
[2] Difference in the amount of large particles ($\geqq 0.5$ μm/mL) immediately after preparation and after 5 months of storage at room temperature;
[3] Surface microroughness (Rq) at a cut-off of 80 μm.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A polishing slurry composition for final polishing a silicon wafer, the composition comprising:
    an abrasive;
    a pH-adjusting agent;
    a water-soluble thickening agent; and
    a chelating agent, wherein:
        the chelating agent includes at least one acetate chelating agent and at least one phosphate chelating agent,
        the polishing slurry composition has an alkaline pH,
        the acetate chelating agent is selected from the group consisting of ethylenediaminetetraacetic acid, diethylenetriaminepentaacetic acid, N-(hydroxyethyl)ethylenediaminetriacetic acid, nitrilotriacetic acid, and salts thereof, and
        the phosphate chelating agent is selected from the group consisting of sodium salts of ethylenediaminetetra(methylene phosphonic acid), ammonium salts of ethylenediaminetetra(methylene phosphonic acid), amino tri(methylene phosphonic acid), and diethylenetriaminepenta(methylene phosphonic acid).

2. The polishing slurry composition as claimed in claim 1, wherein the chelating agent includes two different acetate chelating agents, each of which is selected from the group consisting of ethylenediaminetetraacetic acid, diethylenetriaminepentaacetic acid, N-(hydroxyethyl)ethylenediaminetriacetic acid, nitrilotriacetic acid, and salts thereof.

3. The polishing slurry composition as claimed in claim 1, wherein
    the at least one acetate chelating agent is present at a concentration of between about 0.001 and 0.5 percent by weight, based on the total weight of the slurry composition.

4. The polishing slurry composition as claimed in claim 1, wherein
    the at least one phosphate chelating agent is present at a concentration of between about 0.0002 and 5 percent by weight, based on the total weight of the slurry composition.

5. The polishing slurry composition as claimed in claim 1, wherein the acetate chelating agent is present at a concentration of between about 0.001 and 0.5 percent by weight, based on the total weight of the slurry composition, and
    the at least one phosphate chelating agent is present at a concentration of between about 0.0002 and 5 percent by weight, based on the total weight of the slurry composition.

6. The polishing slurry composition as claimed in claim 1, wherein the ratio of the at least one phosphate chelating agent to the at least one acetate chelating agent is in the range of between about 0.2:1 and 10:1.

7. The polishing slurry composition as claimed in claim 1, wherein the at least one acetate chelating agent is selected from the group consisting of EDTA, Na$_4$EDTA, Na$_2$EDTA, (NH$_4$)$_4$EDTA, and (NH$_4$)$_2$EDTA, and
    the at least one phosphate chelating agent is selected from the group consisting of sodium salts of ethylenediamine tetra(methylene phosphonic acid), and ammonium salts of ethylenediaminetetra(methylene phosphonic acid).

8. The polishing slurry composition as claimed in claim 1, wherein the abrasive includes colloidal silica having an average particle diameter of about 20-100 nm.

9. The polishing slurry composition as claimed in claim 1, wherein the water-soluble thickening agent is water-soluble cellulose having a weight average molecular weight of between about 1,000,000 and 4,000,000.

10. The polishing slurry composition as claimed in claim 8, wherein the colloidal silica has an average particle diameter of about 30-80 nm.

11. The polishing slurry composition as claimed in claim 1, wherein the pH ranges from about 9 to about 11.5.

12. The polishing slurry composition as claimed in claim 8, wherein the water-soluble thickening agent includes a cellulose.

13. A polishing slurry composition for a final process in the production of silicon wafers, the composition comprising:
   an abrasive;
   a pH-adjusting agent;
   a water-soluble thickening agent; and
   a chelating agent, wherein:
      the chelating agent includes at least one acetate chelating agent and at least one phosphate chelating agent,
      the polishing slurry composition has an alkaline pH,
      the acetate chelating agent is selected from the group consisting of ethylenediaminetetraacetic acid, diethylenetriaminepentaacetic acid, N-(hydroxyethyl)ethylenediaminetriacetic acid, nitrilotriacetic acid, and salts thereof, and
      the phosphate chelating agent is selected from the group consisting of sodium salts of ethylenediaminetetra(methylene phosphonic acid), ammonium salts of ethylenediaminetetra(methylene phosphonic acid), amino tri(methylene phosphonic acid), and diethylenetriaminepenta(methylene phosphonic acid).

* * * * *